United States Patent [19]

Ichiyoshi

[11] Patent Number: 4,785,447
[45] Date of Patent: Nov. 15, 1988

[54] FDM DEMULTIPLEXER USING OVERSAMPLED DIGITAL FILTERS

[75] Inventor: Osamu Ichiyoshi, Tokyo, Japan
[73] Assignee: NEC Corporation, Japan
[21] Appl. No.: 155,301
[22] Filed: Feb. 12, 1988

[30] Foreign Application Priority Data

Feb. 17, 1987 [JP] Japan .................................. 62-32557
Feb. 17, 1987 [JP] Japan .................................. 62-32558

[51] Int. Cl.$^4$ .............................................. H04J 4/00
[52] U.S. Cl. ..................................................... 370/70
[58] Field of Search ...................................... 370/70, 50

[56] References Cited

U.S. PATENT DOCUMENTS

| | | | |
|---|---|---|---|
| 3,891,803 | 6/1975 | Daguet et al. ........................ | 370/70 |
| 4,131,764 | 12/1978 | Claasen et al. ........................ | 370/70 |
| 4,312,062 | 1/1982 | Bellanger et al. ..................... | 370/70 |
| 4,412,325 | 10/1983 | Molo ................................... | 370/70 |

OTHER PUBLICATIONS

IEEE Transactions on Communications, vol. COM-22, No. 9, Sep. 1974 "TDM-FDM Transmultiplexer: Digital Polyphase and FFT" Maurice Bellanger, et al.

*Primary Examiner*—Douglas W. Olms
*Attorney, Agent, or Firm*—Laff, Whitesel, Conte & Saret

[57] ABSTRACT

An N-channel FDM signal is converted into complex signals of baseband frequencies spaced at intervals equal to frequency $\Delta f$. The complex baseband signals are converted first into digital samples having a frequency $N\Delta f$ and then into N parallel digital signals. A plurality of first FIR subfilters respectively perform filtering on each of the parallel digital signals at frequency $\Delta f$ to produce a first series of filtered digital signals from each of the first FIR subfilters, and (m−1) groups of second FIR subfilters respectively perform filtering on each of the parallel digital signals at frequency $\Delta f$ to produce a second series of filtered digital samples from each of the second FIR subfilters at timing displaced with respect to the first series by $a/m\Delta f$, where is an integer ranging from unity to (m−1) and m is an integer equal to or greater than 2. Outputs of the first FIR subfilters are combined with outputs of the second FIR subfilters to produce N summation outputs at frequency $m\Delta f$. An N-point Fast Fourier Transform processor performs fast Fourier transform on the N summation outputs at frequency $m\Delta f$ to derive digital channels. Because of the oversampling at frequency $m\Delta f$, each of the digital channels has a frequency response which can be made flat over the bandwidth $\Delta f$.

6 Claims, 9 Drawing Sheets

FDM DEMULTIPLEXER USING OVERSAMPLED DIGITAL FILTERS

BACKGROUND OF THE INVENTION

The present invention relates generally to FDM/TDM transmultiplexers employed as an interface between an FDM (frequency division multiplex) system and a TDM (time division multiplex) system, and more specifically to an FDM demultiplexer for providing wide bandwidth transmission.

Digital processing of an FDM signal for demultiplexing it into baseband signals is described in "TDM-FDM Transmultiplexer: Digital Polyphase and FFT", IEEE Transactions on Communications, Vol. COM-22, No. 9, September 1974. According to the prior art, the incoming FDM signal is digitized and converted to parallel form and filtered through digital subfilters at a sampling frequency equal to the channel bandwidth. Due to this sampling frequency, each of the resultant digital channels has a frequency response which is flat over a region narrower than the channel bandwidth.

SUMMARY OF THE INVENTION

It is therefore an object of the present invention to provide a digital FDM demultiplexer capable of transmission of signals having a frequency response which is flat over a range equal to or greater than the bandwidth of the baseband signal.

According to the present invention, an N-channel FDM (frequency division multiplexed) signal is converted into complex signals of baseband frequencies spaced at intervals equal to frequency $\Delta f$. The complex baseband signals are converted first into digital samples having a frequency $N\Delta f$ and then into N parallel digital signals. A plurality of first finite impulse response (FIR) subfilters respectively perform filtering on the parallel digital signals at frequency $\Delta f$ to produce a first series of filtered digital signals from each of the first FIR subfilters, and (m−1) groups of second FIR subfilters respectively perform filtering on the parallel digital signals at frequency if to produce a second series of filtered digital samples from each of the second FIR subfilters at timing displaced with respect to the first series by $a/m\Delta f$, where a is an integer ranging from unity to (m−1) and m is an integer equal to or greater than 2. Outputs of the first FIR subfilters are combined with outputs of the second FIR subfilters to produce N summation outputs at frequency $m\Delta f$. An N-point Fast Fourier Transform (FFT) processor performs fast Fourier transform on the N summation outputs at frequency $m\Delta f$ to derive digital channels. Because of the oversampling at frequency $m\Delta f$, each digital channel has a frequency response which can be made flat over bandwidth $\Delta f$.

In a preferred embodiment, first and second frequency converters are provided for respectively converting first and second outputs of the FFT processor into a first signal of a higher frequency range and a second signal of a lower frequency range. The first and second signals are combined into a wideband signal.

BRIEF DESCRIPTION OF THE DRAWINGS

The present invention will be described in further detail with reference to the accompanying drawings, in which.

DETAILED DESCRIPTION

Figure 1:
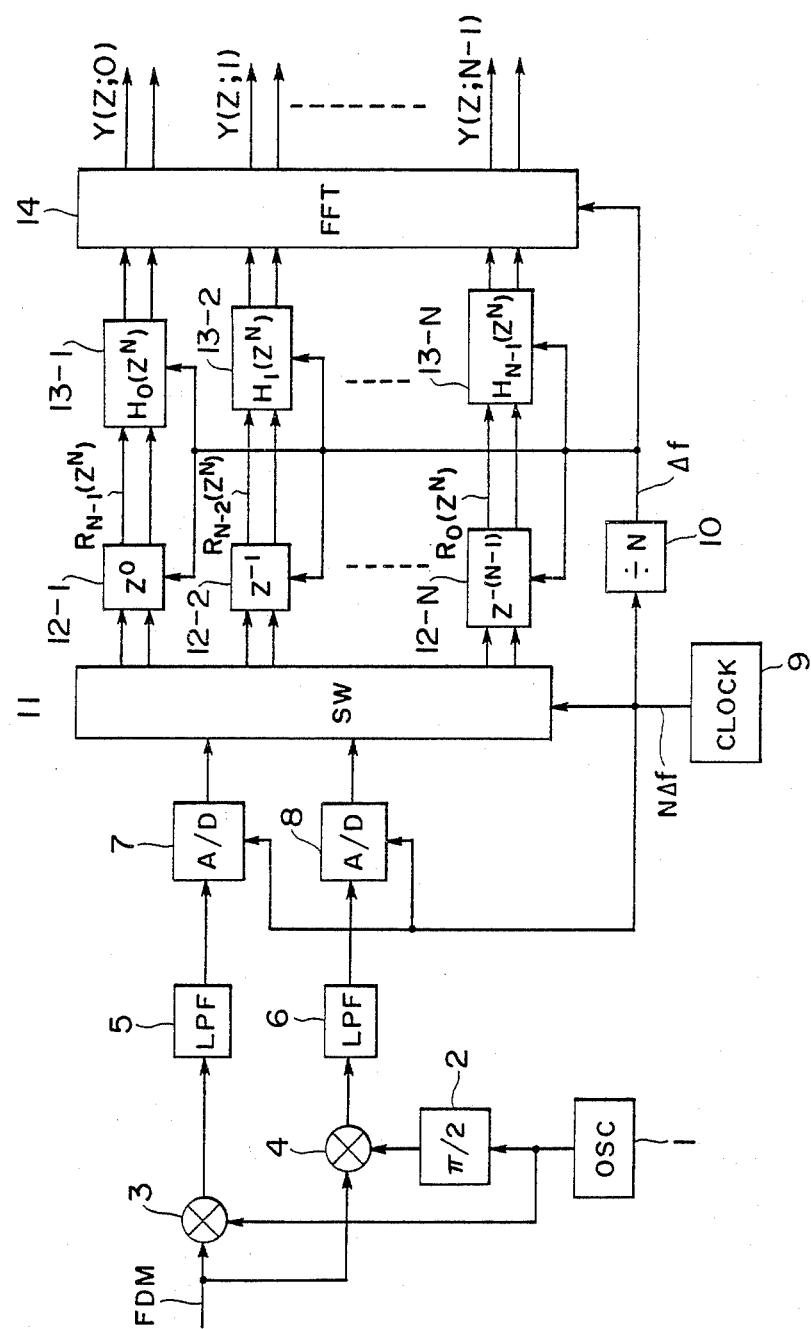
FIG. 1 is a block diagram of a prior art FDM demultiplexer for an FDM/TDM transmultiplexer.
Figure 2:
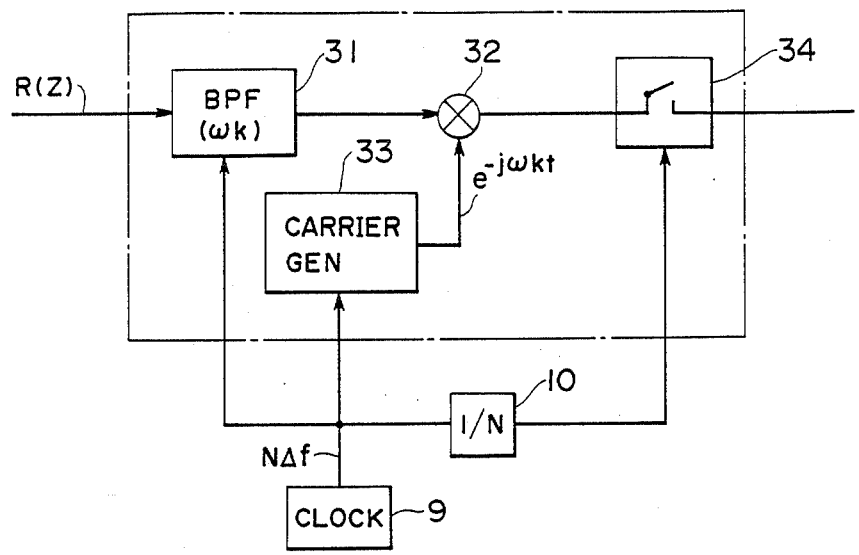
FIG. 2 is a schematic diagram useful for understanding the operating principle of the prior art FDM demultiplexer.
Figure 3A:
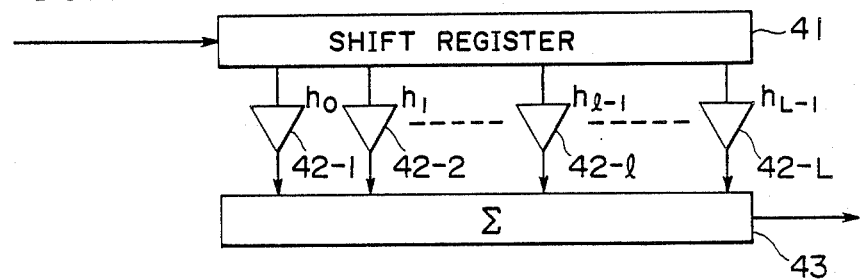
FIGS. 3a and 3b are circuit diagrams of a finite impulse response digital filter and equivalent digital subfilters.
Figure 3B:
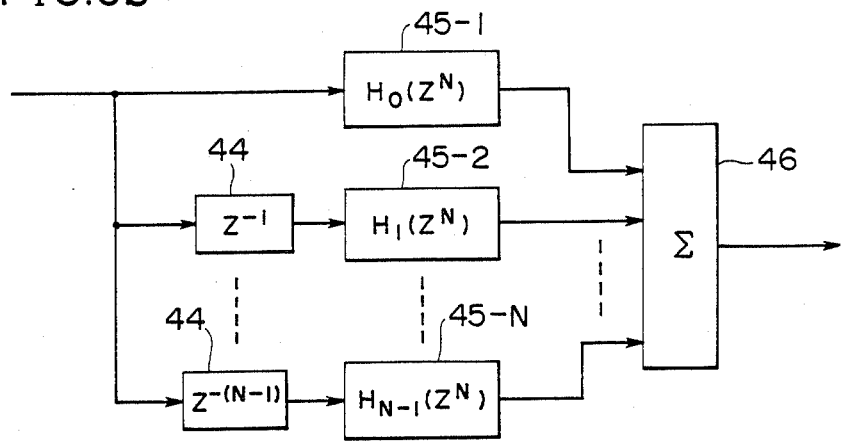

Before describing the present invention, it is appropriate to describe a prior art digital FDM (frequency division multiplex) demultiplexer of an FDM-TDM transmultiplexer with reference to FIGS. 1 to 5. In FIG. 1, an SSB-FDM signal is applied to mixers 3 and 4. For demodulating the incoming FDM signal, quadrature versions of a carrier are supplied from a local oscillator 1 and a $\pi/2$ phase shifter 2 to the mixers 3 and 4 to produce complex signals. The out-of-band components of the complex signals are removed by low-pass filters 5 and 6. A clock generator 9 has a clock frequency $N\Delta f$, where N is an even number representing the number of channels carried by the FDM signal and $\Delta f$ represents the bandwidth of each channel. Analog-to-digital converters 7 and 8 cooperate with the clock generator 9 to perform conversion of the complex signals into digital form and feed digital complex signals to a switching circuit 11 which is driven at frequency $N\Delta f$ by the clock generator 9 to distribute the digital inputs to its output terminals. A frequency divider 10 divides the frequency of the clock pulse by a factor N and drives a plurality of delay circuits 12-1 through 12-N connected to the respective output terminals of switching circuit 11. Delay circuit 12-N introduces a delay time corresponding to (N−1) digital samples and delay circuit 12-1 provides a least, or zero delay time. Switching circuit 11 applies the digitized complex signals to the delay circuit 12-N first in a series of N digital samples. The outputs of the switching circuit 11 are shifted to the next at intervals $1/N\Delta f$ so that N digital samples appear at the same time in a common time interval. The N digital outputs of delay circuits 12-1 through 12-N, which are represented respectively by $R_{N-1}(Z^N)$, $R_{N-2}(Z^N)$, ... $R_0(Z^N)$, are fed to digital subfilters 13-1 through 13-N having respective filter functions $H_0(Z^N)$, $H_1(Z^N)$, ... $H_{N-1}(Z^N)$. These digital subfilters are driven by at frequency $\Delta f$ by frequency divider 10. An N-point Fast Fourier Transform processor 14 is coupled to the outputs of digital subfilters 13-1 through 13-N to produce digital outputs $Y(Z;0)$, $Y(Z;1)$, ... $Y(Z;N-1)$. As shown in FIG. 2, the FDM demultiplexer can be schematically represented by an equivalent circuit comprising a digital band-pass filter 31 having a center frequency ωk or passing the associated digital signal R(Z) to a multiplier 32 which multiplies it with a carrier $e^{-j\omega kt}$ from a carrier generator 33. The output of multiplier 32 is sampled by a sampler 34 at frequency Δf. The FDM demultiplexer has a basic low-pass filter characteristic of an FIR (finite impulse response) digital filter which is shown in FIG. 3a as comprising a shift register 41, an array of multipliers 42 connected to the shift register stages and an adder 43 for summing the outputs of multipliers 42. The basic low-pass filter characteristic of such a digital filter is given by:

$$H(z) = \sum_{l=0}^{L-1} h_l \cdot Z^{-l} \quad (1)$$

where, L represents the number of multipliers 42 and $h_l$ represents the multiplying factor of multiplier 42-(l−1). Since the digital filter can be divided into a plurality of delay circuits 44 and N subfilters 45-1, 45-i, ... 45-N as shown in FIG. 3b. Equation (1) can be rewritten as:

$$H(z) = \sum_{i=1}^{N-1} Z^{-i} \cdot H_i(Z^N) \quad (2)$$

where, $$H_i(z) = \sum_{l=0}^{(L/N)-1} h_{lN+i} \cdot (Z^N)^{-l} \quad (3)$$

$$Z = e^{j\omega T} = e^{j\omega/N\Delta f} \quad (4)$$

$$T = 1/N\Delta f \quad (5)$$

By substituting $e^{j(\omega - \omega k)T} = e^{-j(2\pi k/N)}Z$ for Z, the transfer function of the digital band-pass filter 31 of FIG. 2 is given by:

$$H(z;k) = \sum_{i=0}^{N-1} e^{j(2\pi/N)ki} \cdot Z^{-i} \cdot H_i(Z_N) \quad (6)$$

where, $\omega_k = k\Delta\omega = k(2\pi\Delta f)$ and where k=0, ±1, ±2, ..., ±(N/2)−1.

Each of the outputs of analog-to-digital converters 7 and 8 is given by:

$$R(z) = \sum_n r_n Z^{-n} \quad (7)$$

where, $r_n$ represents a series of "n" complex signals comprising real and imaginary parts. In a manner similar to the subfilter divisions, Equation (7) can be written as:

$$R(z) = \sum_{l=0}^{N-1} Z^{-l} \cdot R_l(Z^N) \quad (8)$$

$$R_l(Z^N) = \sum_n r_{nN+l} \cdot (Z^N)^{-n} \quad (9)$$

Therefore, the output signal of the band-pass filter 31 is given by the following relation:

$$H(z;k) \cdot R(z) = \sum_{i=0}^{N-1} \sum_{l=0}^{N-1} Z^{-(l+i)} e^{j(2\pi/N)ki} \cdot H_i(Z^N) R_l(Z^N) \quad (10)$$

Figure 4:
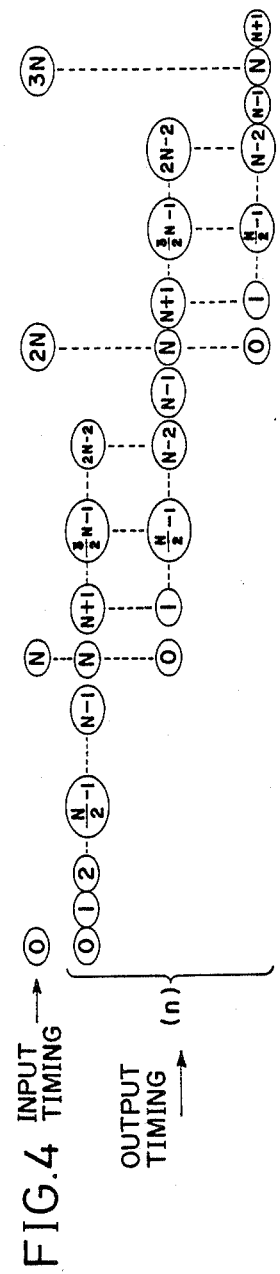
FIG. 4 is a timing diagram of an FDM demultiplexer.

By substituting $e^{j(\omega + \omega k)T} = z \cdot e^{j(2\pi/N)k}$ for z to perform frequency conversion on the output of the band-pass filter k (ωk to 0 radian/second), the following relation holds:

$$H(z;k)R(z)|_{z \to z \cdot e^{j(2\pi/N)K}} \quad (11)$$

$$= \sum_{i=0}^{N-1} \sum_{l=0}^{N-1} e^{-j(2\pi/N)kl} Z^{-(l+i)} H_i(Z^N) R_l(Z^N)$$

$$= \sum_{n=0}^{2N-2} \sum_{l=0}^{N-1} e^{-j(2\pi/N)kl} Z^{-n} H_{n-l}(Z^N) R_l(Z^N)$$

where, $H\alpha = 0$ ($\alpha < 0, \alpha > N$). The term $Z^{-n}$ in Equation (11) implies that interpolation occurs at intervals T between digital samples that occur at intervals NT (=1/Δf). If the timing of the term $Z^{-n}H_{n-l}(Z^N)R_l(Z^N)$ is 0, N, 2N, ..., then the interporation timing is as shown in FIG. 4. In the prior art FDM demultiplexer, n=N−1, i.e., the frequency-converted output of the band-pass filter is sampled at intervals Δf. With n=N−1, the output Y(z;k) of the FDM demultiplexer is given by:

$$Y(z;k) = Z^{-(N-1)} \sum_{l=0}^{N-1} e^{-j(2\pi/N)kl} \cdot H_{N-1-l}(Z^N) \cdot R_l(Z^N) \quad (12)$$

Equation (12) is implemented by the circuit of FIG. 1. While this type of FDM demultiplexer is capable of implementation as a plurality of filters having accurately determined frequency responses by a single digital circuit, it is incapable of realizing a filter characteristic which is flat over a range limited to frequency Δf due to the sampling at the same frequency as the channel bandwidth. If the filter bandwidth is wider than Δf, interference would occur between adjacent channels due to aliasing, or if a flat frequence response is desired, complex analog low-pass filters would be required to provide sharp cut-off characteristic.

Figure 5:
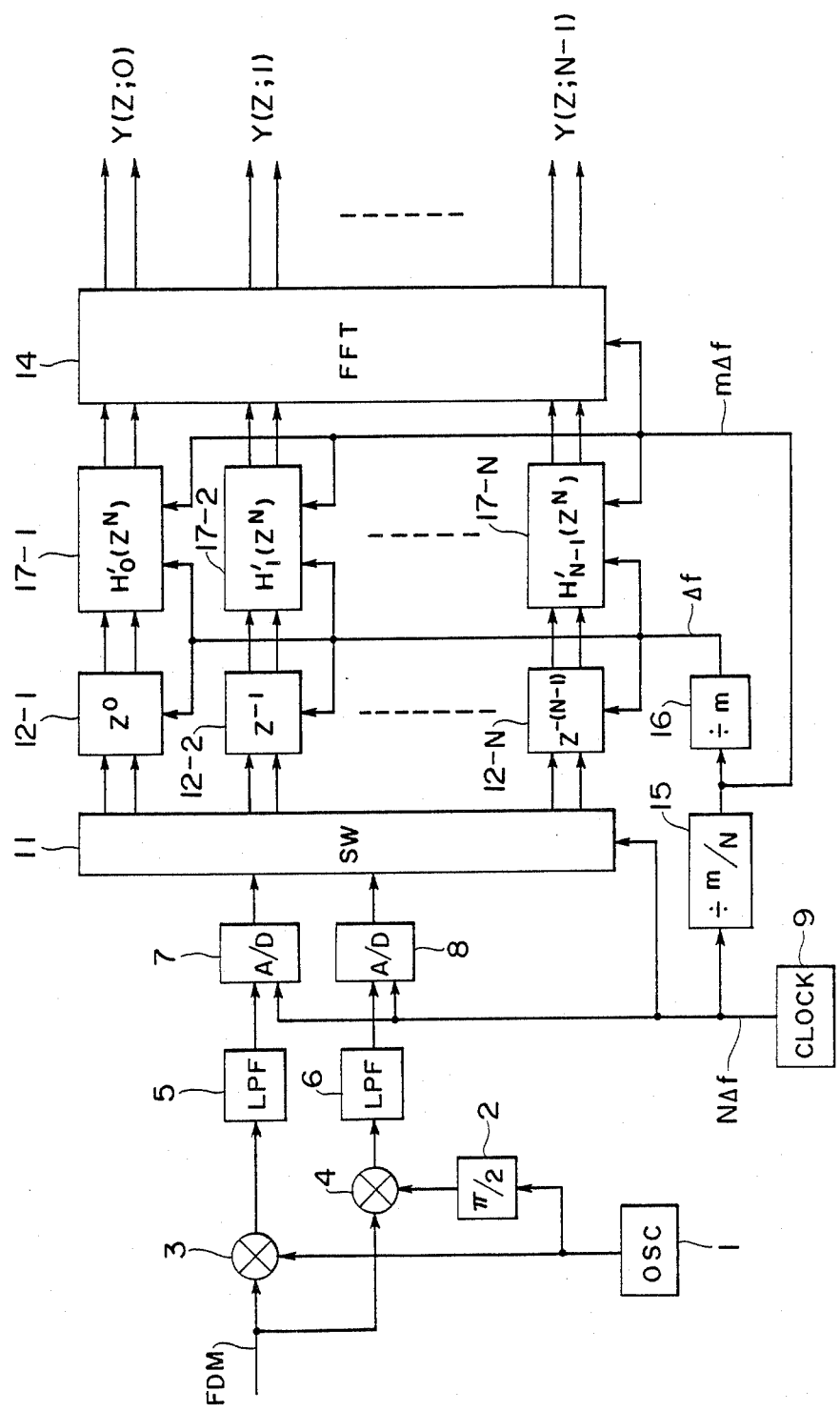
FIG. 5 is a block diagram of an FDM demultiplexer according to the present invention.

Referring now to FIG. 5, there is shown a digital FDM demultiplexer according to the present invention. In FIG. 5, parts corresponding to those in FIG. 1 are marked with same numerals as used in FIG. 1. The SSB-FDM input signal is quadrature demodulated into complex signals by mixers 3 and 4 and applied through low-pass filters 5 and 6 to analog-to-digital converters 7 and 8 which are driven at frequency NΔf and distributed by switching circuit 11 to delay circuits 12 as in the prior art. The FDM demultiplexer of the invention differs from the prior art in that it includes frequency dividers 15 and 16 connected to the clock generator 9 and digital subfilters 17-1 through 17-N instead of subfilters 13-1 through 13-N of FIG. 1. Frequency divider 15 divides the clock frequency NΔf with a factor N/m (where m is equal to or greater than 2) to produce a first sampling pulse at frequency mΔf and the frequency divider 16 divides this frequency with a factor m to produce a second sampling pulse at frequency Δf. The first sampling pulse at frequency mΔf is supplied to all the digital subfilters 17 and the second sampling pulse at frequency Δf is supplied to all the delay circuits 12 and subfilters 17 having transfer functions H′$_0$(Z$^N$), H′$_1$(Z$^N$), ..., H′$_{N-1}$(Z$^N$).

Figure 6:
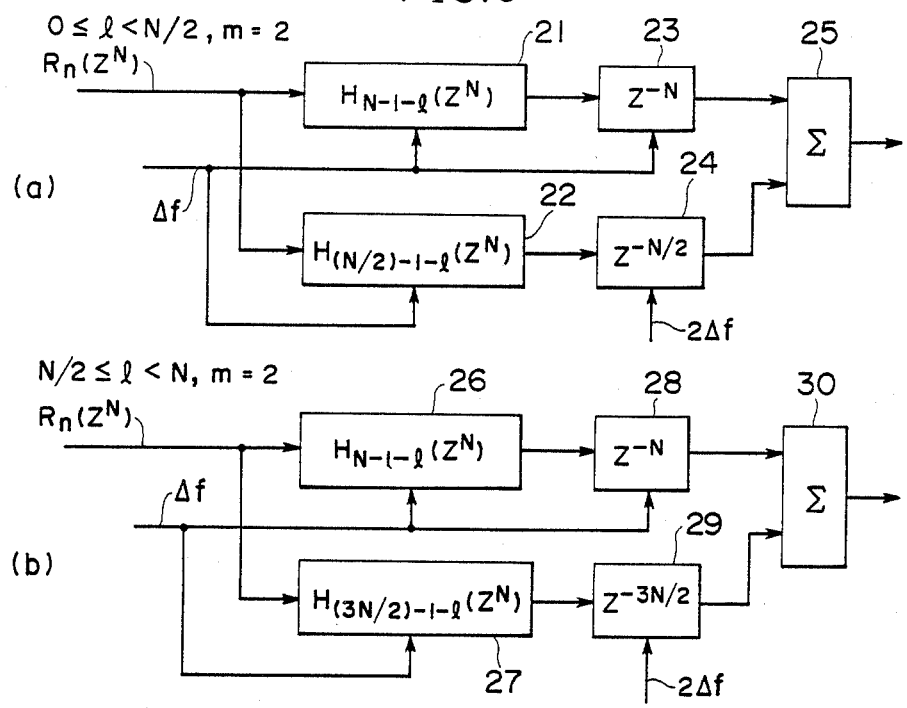
FIG. 6. is a circuit diagram of the digital subfilters of FIG. 5.
Figure 7:
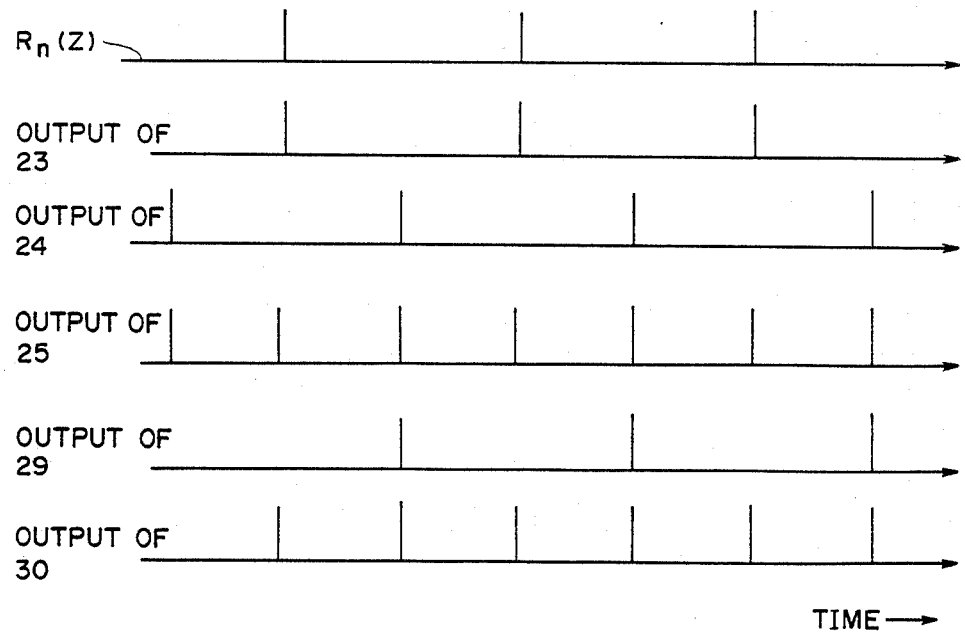
FIG. 7 is a timing diagram associated with the circuit of FIG. 6.

As illustrated in FIG. 6, the digital subfilters 17 comprise a first pair of subfilters 21, 22, delay circuits 23, 24 connected respectively to the outputs of subfilters 21, 22 and an adder 25 for summing the outputs of delay circuits 23, 24 as shown in part (a) and a second pair of subfilters 26, 27, delay circuits 28, 29 connected respectively to the outputs of subfilters 26, 27 and an adder 30 for summing the outputs of delay circuits 28, 29 as shown in part (b). The circuit shown in part (a) is used for filters where $0 \leq l < N/2$ and the one shown in part (b) is used for filters where $N/2 \leq l < N$. Subfilters 21 and 26 have identical transfer function $H_{N-1-l}(Z^N)$. Subfilters 22 and 27 have transfer functions $H_{(N/2)-1-l}(Z^N)$ and $H_{(3N/2)-1-l}(Z^N)$, respectively. Subfilters 21, 26, 22 and 27 and delay circuits 23 and 28 are driven by the sampling pulse at frequency $\Delta f$, and delay circuits 24 and 29 are driven by the sampling pulse at frequency $2\Delta f$. The inputs of subfilters 21 and 22 are tied together to receive an input digital sample $Rn(Z^N)$ and their outputs are delayed by N and N/2 samples, respectively, so that the output of delay circuit 24 leads the output of delay circuit 23 by N/2 samples (see FIG. 7). Likewise, the inputs of subfilters 26 and 27 are tied together to receive input digital samples $Rn(Z^N)$ and their outputs are delayed by N and 3N/2 samples, respectively, so that the output of delay circuit 29 lags behind the output of delay circuit 28 by N/2 samples. Thus, when m=2, adders 25 and 30 provide output digital samples twice the rate of the incoming digital samples as illustrated in FIG. 7. If m is 3, two groups of subfilters and delay circuits similar to those shown at 22, 27, 24 and 29 are required. Namely, one of the groups filters each of the parallel digital samples at frequency $\Delta f$ and delivers a series of filtered samples from each delay circuit at frequency $3\Delta f$ so that each output sample is displaced by $\frac{1}{3}m\Delta f$ from the outputs of delay circuits 23 and 28, and the other group filters each digital sample at frequency $\Delta f$ and delivers a series of filtered samples from each delay circuit at frequency $3\Delta f$ so that each output sample is displaced by $\frac{2}{3}m\Delta f$ from the outputs of delay circuits 23, 28. Thus, (m−1) groups of subfilters and delay circuits similar to those shown at 22, 27, 24 and 29 are provided for filtering at frequency $\Delta f$ and delivering filtered samples at frequency $m\Delta f$ so that they are displaced by $a/m\Delta f$ from the outputs of delay circuits 23 and 28, where a is an integer ranging from unity to (m−1).

Therefore, the FDM demultiplexer of the present invention provides oversampling at frequency $M\Delta f$, rather than at frequency $\Delta f$. If m is 2, sampling occurs at points where n=N−1, n=(N/2) and n=(3/N2)−1. A mathematical analysis of the circuit of FIG. 5 gives digital output samples Y'(z;k) which are given by:

$$Y'(z;k) = Z^{-(N/2)-1} \sum_{l=0}^{N-1} e^{-j(2\pi/N)kl} \cdot H_{(N/2)-1-l}(Z^N) \cdot \quad (13)$$

$$Rl(Z^N) + Z^{-(N-1)} \sum_{l=0}^{N-1} e^{-j(2\pi/N)kl} \cdot H_{N-1-l}(Z^N) \cdot Rl(Z^N) +$$

$$Z^{-(3N/2)-1} \sum_{l=0}^{N-1} e^{-j(2\pi/N)kl} \cdot H_{(3N/2)-1-l}(Z^N) \cdot Rl(Z^N)$$

Equation (13) can be rewritten as:

$$Y'(z;k) = Z^{-(N-1)} \sum_{l=0}^{N-1} e^{-j(2\pi/N)kl} \cdot H'_{N-1-l}(Z^N) \cdot Rl(Z^N) \quad (14)$$

where, $$H'_{N-1-l}(Z^N) = Z^{N/2} \cdot H_{(N/2)-1-l}(Z^N) + H_{N-1-l}(Z^N) + \quad (15a)$$

$$Z^{-N/2} \cdot H_{(3N/2)-1-l}(Z^N) \quad (15b)$$

$$= H_{N-1-l}(Z^N) + Z^{N/2} \cdot H_{(N/2)-1-l}(Z^N)$$

(for $0 \leq l < N/2$)

$$= H_{N-1-l}(Z^N) + Z^{-N/2} \cdot H_{(3N/2)-1-l}(Z^N)$$

(for $N/2 \leq l < N$)

where Equations (15a) and (15b) describe the transfer functions of subfilters shown in part (a) and part (b) of FIG. 6, respectively.

Figure 8:
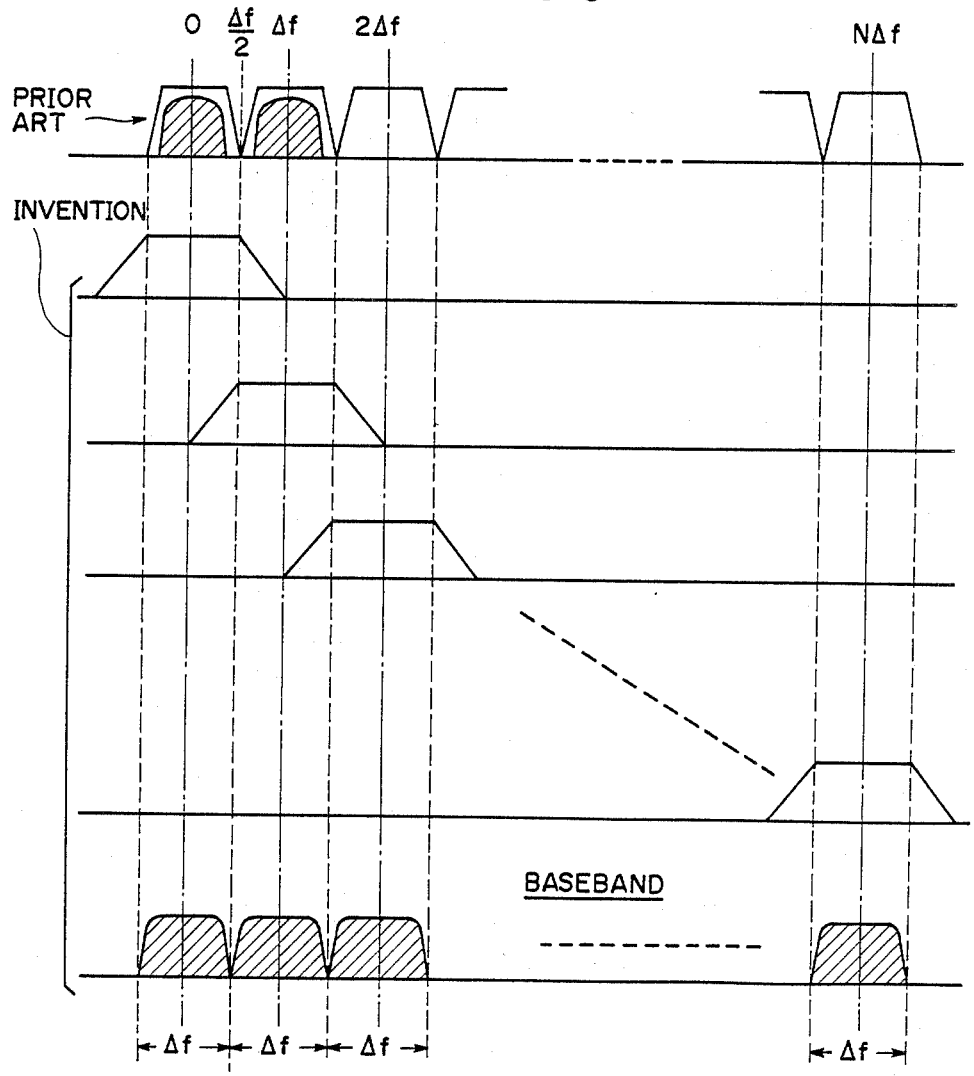
FIG. 8 is a spectrum diagram useful for an understanding of the present invention with the spectrum of the prior art for purposes of comparison.

As illustrated in FIG. 8, for m=2, each of the N channels has a frequency response which extends gradually over twice the bandwidth $\Delta f$ of the prior art FDM demultiplexer without causing aliasing and a flat response region extending over the channel bandwidth $\Delta f$ without overlapping the flat region of adjacent channels. Thus, the flat region of each channel is greater than that of the prior art channel.

Figure 9:
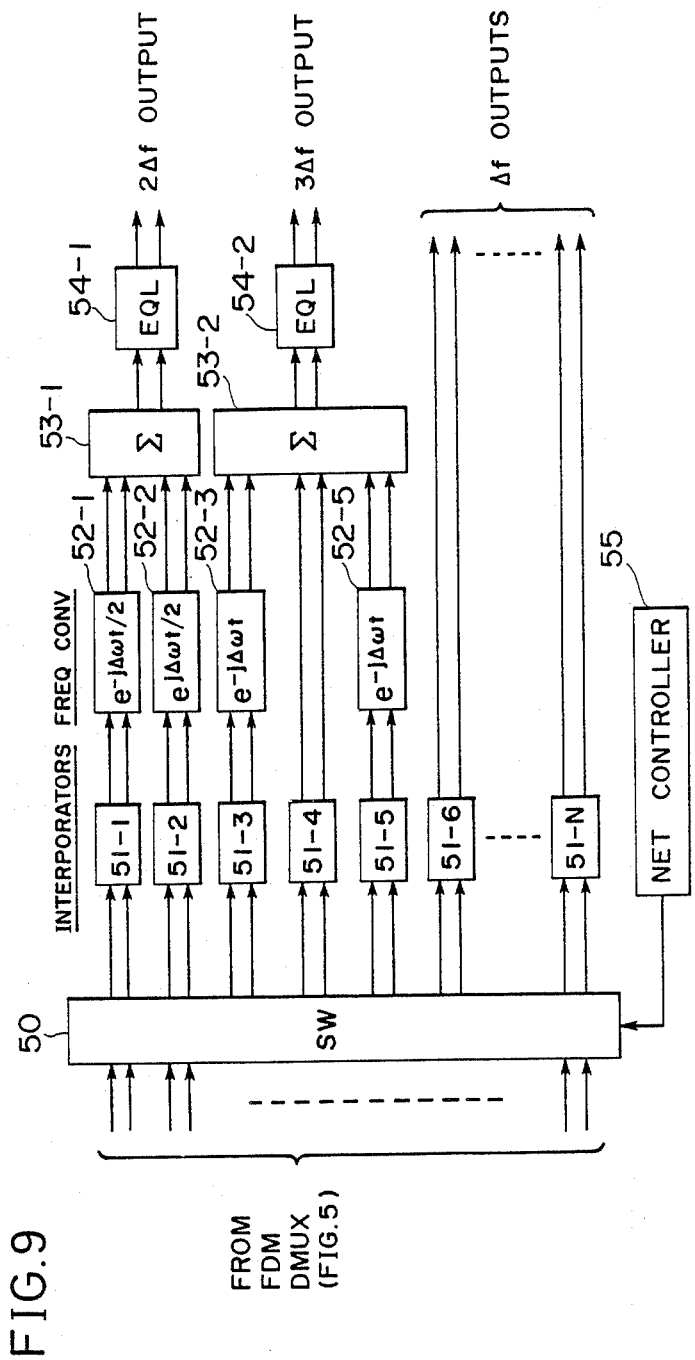
FIG. 9 is a block diagram of a bandwidth expansion circuit according to the present invention.

Because of the flat frequency spectrum over the channel bandwidth $\Delta f$, two or more of the digital outputs of the FDM demultiplexer can be advantageously combined in a bandwidth expanding circuit shown in FIG. 9 to provide wide-bandwidth signals.

In FIG. 9, the bandwidth expanding circuit includes a switching matrix 50 to which the digital complex signals from the FDM demultiplexer of FIG. 5 are applied. A plurality of digital interpolators 51-1 through 51-N are connected to the outputs of switching matrix 50 to perform digital interpolation on switched digital samples. These digital interpolators operate in a manner similar to analog low-pass filter to generate extra digital samples between input digital samples to smooth the transition from one sample to the next. Frequency converters 52-1 and 52-2 are connected to interpolators 51-1 and 51-2, respectively, to raise the frequency spectrum of the output interpolator 51-1 by frequency $\Delta f/2$ and lower the frequency spectrum of the output of interpolator 51-2 by the same amount so that their frequency spectrums are converted to higher and lower frequency ranges, respectively, as shown in parts (a) and (b) of FIG. 10. The outputs of frequency converters 52-1 and 52-2 are summed together in an adder 53-1, whereby the higher and lower frequency ranges merge into a single wideband signal having a flat response region extending over twice the channel bandwidth $\Delta f$, as illustrated in part (c) of FIG. 10. In like manner, the outputs of interpolators 51-3 and 51-5 are supplied to frequency converters 52-3 and 52-5, respectively, where their spectrums are shifted by frequency $\Delta f$ in opposite directions so that when the outputs of frequency converters 52-3 and 52-5 and the output of interpolator 51-4 are summed together by an adder 53-2, the combined spectrums merge into a single wideband having a flat response region spanning three times the channel bandwidth $\Delta f$.

Digital complex signals having twice the channel bandwidth are switched to interpolators 51-1 and 51-2 and those having three times the channel bandwidth are switched to interpolators 51-3, 51-4 and 51-5. On the other hand, signals having the channel bandwidth $\Delta f$ are switched respectively to interpolators 51-6 through 51-N. These switching operations are effected in response to a switching signal supplied from a network controller 55.

Figure 10:
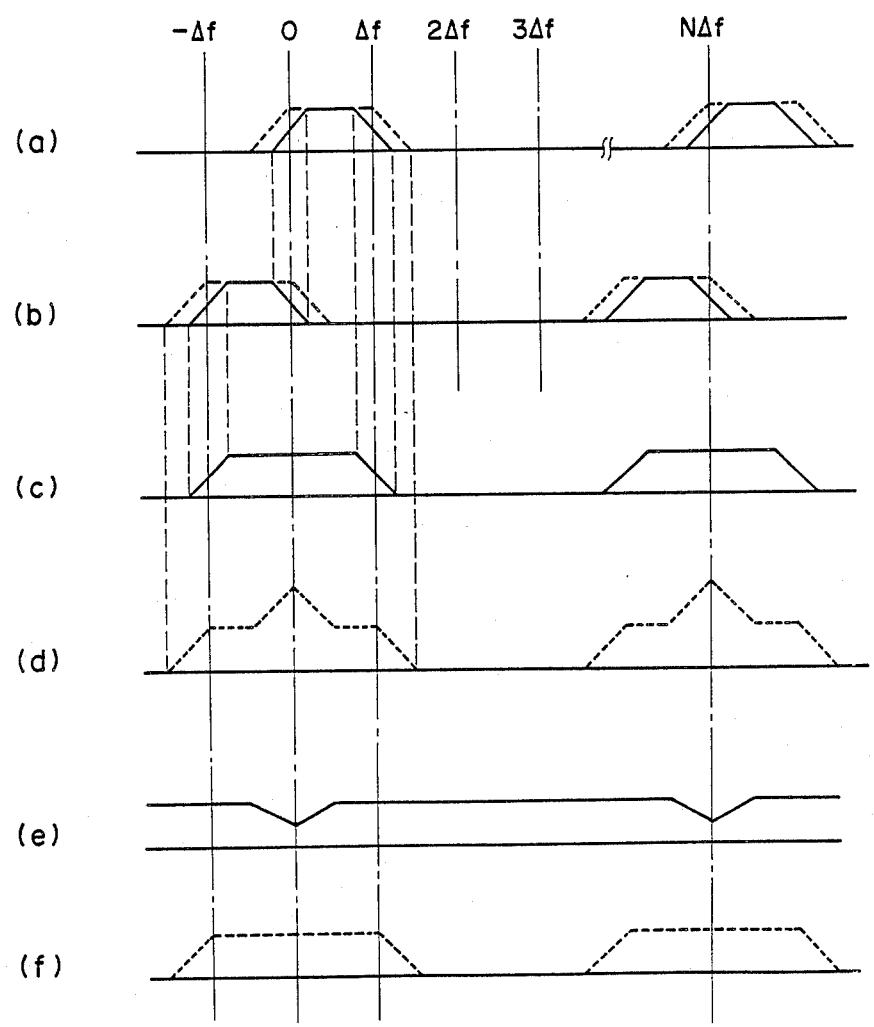
FIG. 10 is a spectrum diagram associated with the embodiment of FIG. 9.

If the merging of adjacent frequency spectrums results in a raised spectral component as shown in part (d) of FIG. 10, it is preferable to respectively connect each of the outputs of adders 53-1 and 53-2 to digital filters, or equalizers 54-1 and 54-2 having a complementary frequency response as shown in part (e) to compensate for such spectral humps.

Figure 11:
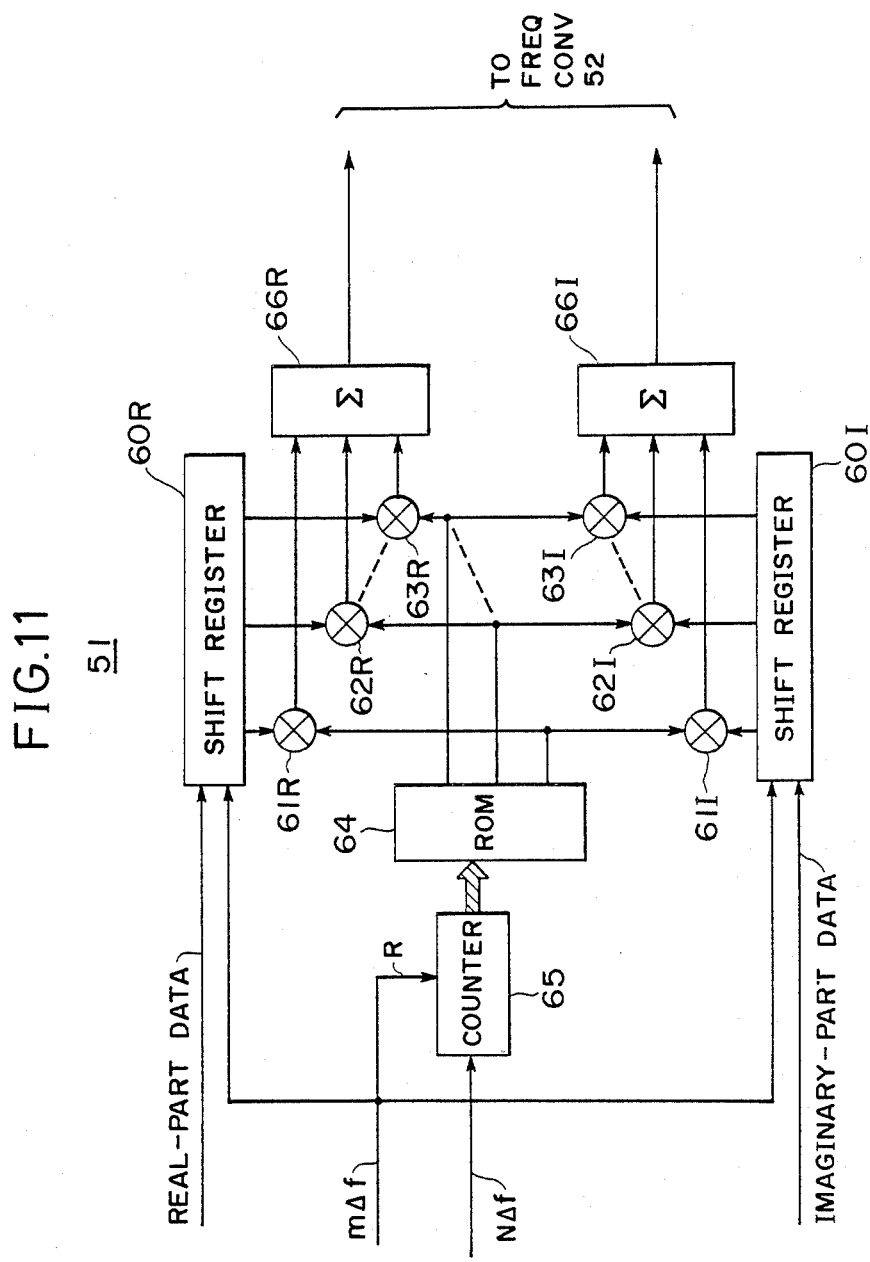
FIG. 11 is a circuit diagram of each of the interpolators of FIG. 9.

As illustrated in FIG. 11, each of the digital interpolators 51 comprises a pair of shift registers 60R and 60I to which the real and imaginary parts of a digital complex signal from the associated output terminals of the switching matrix are supplied, respectively. Shift registers 60R and 60I are clocked at frequency mΔf to successively shift and apply the clocked real-part digital samples to digital multipliers 61R, 62R and 63R and successively shift and apply the clocked imaginary-part digital samples to digital multipliers 61I, 62I and 63I. Digital multiplying factors are supplied from a read only memory 64, which is accessed by the binary output of a counter 65 driven at clock frequency NΔf. This counter is reset in response to the mΔf clock pulse. The outputs of multipliers 61R, 62R and 63R are summed together in an adder 66R and the outputs of multipliers 61I, 62I and 63I are summed together in an adder 66I. The outputs of adders 66R and 66I are fed to the associated frequency converter 52. Therefore, interpolations occur at frequency NΔf and hence additional N digital samples are produced between successive input digital samples.

Figure 12:
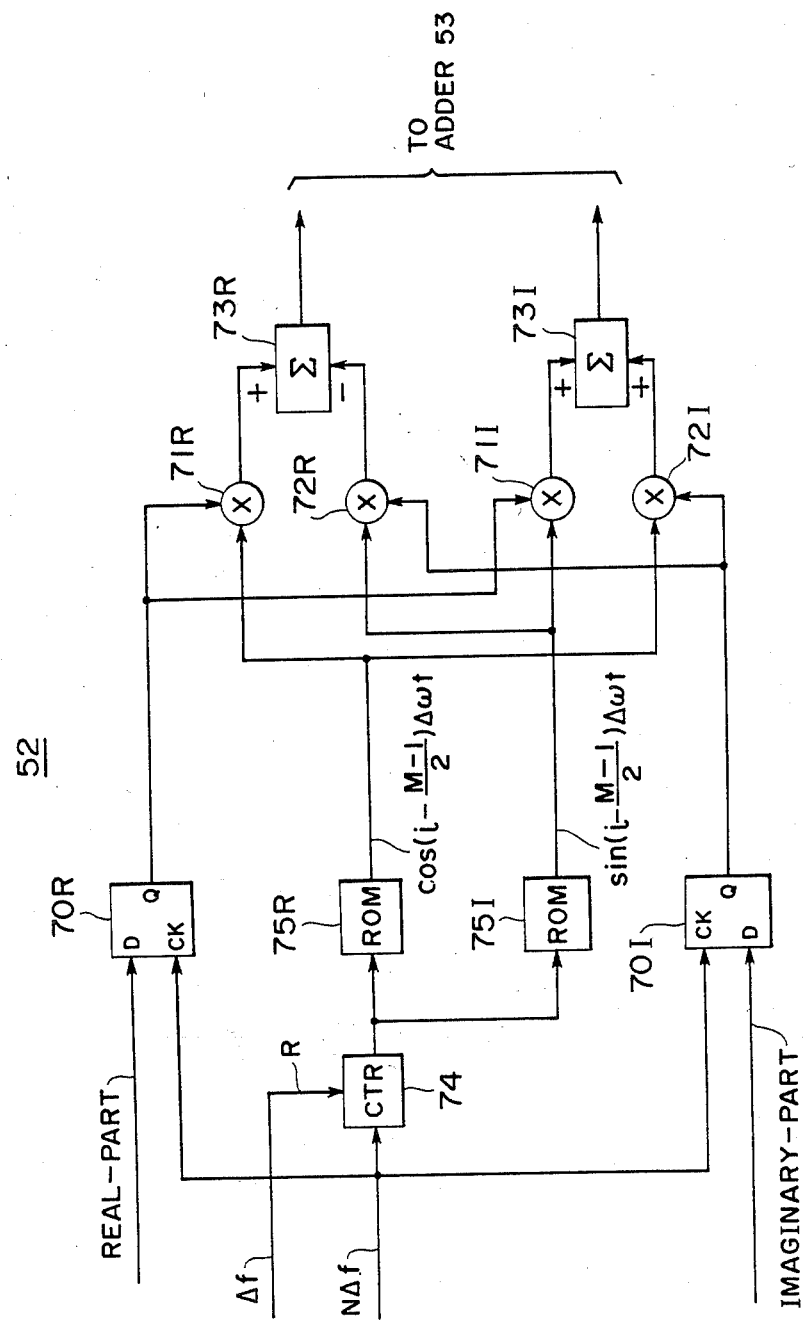
FIG. 12 is a circuit diagram of each of the frequency converters of FIG. 9.

In FIG. 12, each frequency converter which converts the frequency of the input complex signals to a higher frequency range includes D flip-flops 70R and 70I which are clocked at frequency NΔf. Real- and imaginary-part digital samples from the associated interpolator are fed to the data inputs of flip-flops 70R and 70I to generate real-part otput digital samples synchronized with the NΔf-clock timing for coupling to multipliers 71R and 71I and generate NΔf-clock synchronized imaginary-part output digital samples for coupling to multipliers 72R and 72I. A counter 74, driven at NΔf-clock frequency and reset at Δf-clock frequency, addresses read only memories 75R and 75I to supply a digital carrier $\cos\{i-(M-1)/2\}\Delta\omega t$ to multipliers 71R and 72I and supply a digital carrier $\sin\{i-(M-1)/2\}\Delta\omega t$ to multipliers 72R and 71I, where i is an integer in the range between 0 and M−1 and M represents the multiplying factor of the expanded bandwidth with respect to the basic channel bandwidth Δf. Since the multipliers 71R, 72R, 71I and 72I are essentially a pair of balanced modulators, the outputs of multipliers 71R and 72R, when subtracted from each other by a subtractor 73R and summed in an adder 73I, result in a frequency conversion of the complex signals to a higher frequency range. Each of the frequency converters which perform frequency conversion to a lower frequency range is identically constructed to that shown in FIG. 12 with the exception that the read only memory 75I produces $-\sin\{i-(M-1)/2\}\Delta\omega t$.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. An FDM demultiplexer comprising:

means for converting an N-channel FDM (frequency division multiplexed) signal into complex signals of baseband frequencies, the channels of said FDM signal being spaced at frequency Δf;

analog-to-digital converting means for converting said complex signals into digital samples having a frequency NΔf;

serial-to-parallel converter means for converting a series of N digital samples of said complex signals into N parallel digital signals;

a plurality of first finite impulse response (FIR) subfilter means for respectively filtering said parallel digital signals at frequency Δf to produce a first series of filtered digital signals from each of said first FIR subfilter means;

(m−1) groups of second FIR subfilter means, the second FIR subfilter means of each of said (m−1) groups respectively filtering said parallel digital signals at frequency Δf and delivering a second series of filtered digital samples from each of said second FIR subfilter means at timing displaced with respect to said first series by a/mΔf, where a is an integer ranging from unity to (m−1) and m is an integer equal to or greater than 2;

a plurality of adders for respectively summing outputs of said first FIR subfilter means with outputs of said second FIR subfilter means to produce N summation outputs at frequency mΔf; and an N-point Fast Fourier Transform (FFT) processor connected to said adders for performing fast Fourier transform on said N summation outputs at frequency mΔf.

2. An FDM demultiplexer as claimed in claim 1, wherein said second FIR subfilter means are divided into first and second groups, outputs of said second FIR subfilter means of said first group leading outputs of said first FIR subfilter means by a·N/m digital samples and outputs of said second FIR subfilter means of said second group lagging behind the outputs of said first FIR subfilter means by a·N/m digital samples.

3. An FDM demultiplexer as claimed in claim 1, further comprising:

first and second frequency converter means for respectively converting first and second outputs of said FFT processor into a first signal of a higher frequency range and a second signal of a lower frequency range; and means for combining said first and second signals into a wideband signal.

4. An FDM demultiplexer as claimed in claim 3, wherein said combining means additionally combines a third output of said FFT processor with said first and second signals so that said wideband signal has a bandwidth three times the bandwidth of each of said first, second and third outputs of said FFT processor.

5. An FDM demultiplexer as claimed in claim 3, further comprising switching means for selectively coupling said first and second outputs of said FFT processor to said first and second frequency converter means, respectively, in response to a control signal.

6. An FDM demultiplexer as claimed in claim 3, further comprising first and second FIR low-pass filter means for respectively filtering said first and second outputs of said FFT processor and applying the filtered outputs to said first and second frequency converter means, respectively.

* * * * *